(12) United States Patent
Arrouy et al.

(10) Patent No.: US 7,800,355 B2
(45) Date of Patent: Sep. 21, 2010

(54) APPARATUS FOR MEASURING THE ELECTRICAL ENERGY DELIVERED TO A RAIL TRACTION UNIT BY A HIGH VOLTAGE LINE

(75) Inventors: Jean-Marie Arrouy, Bours (FR); Maurice Couget, Bours (FR); Olivier Dosda, Notre Dame DU PE (FR); Claude LeJeune, La Fleche (FR)

(73) Assignee: Alstom Transport SA, Levallois-Perret (FR)

( * ) Notice: Subject to any disclaimer, the term of this patent is extended or adjusted under 35 U.S.C. 154(b) by 152 days.

(21) Appl. No.: 11/880,738

(22) Filed: Jul. 24, 2007

(65) Prior Publication Data

US 2008/0024112 A1 Jan. 31, 2008
US 2009/0128122 A9 May 21, 2009

(30) Foreign Application Priority Data

Jul. 25, 2006 (FR) .................................. 06 06797

(51) Int. Cl.
*G01R 11/32* (2006.01)
(52) U.S. Cl. ..................................................... 324/142
(58) Field of Classification Search ........................ None
See application file for complete search history.

(56) References Cited

U.S. PATENT DOCUMENTS

| 4,810,836 | A | * | 3/1989 | Shinoda et al. ............. 174/139 |
| 5,140,255 | A | * | 8/1992 | Tardio et al. ................. 323/322 |
| 5,202,812 | A | * | 4/1993 | Shinoda et al. ............... 361/65 |
| 5,336,991 | A | * | 8/1994 | Atherton et al. ............. 324/142 |
| 5,585,611 | A | | 12/1996 | Harvey et al. |
| 2006/0012386 | A1 | * | 1/2006 | Lourdel et al. .............. 324/750 |
| 2006/0291856 | A1 | | 12/2006 | Hampel |
| 2010/0006385 | A1 | * | 1/2010 | Aubigny et al. ................ 191/2 |

FOREIGN PATENT DOCUMENTS

| DE | 195 43 363 A1 | 5/1997 |
| DE | 100 05 164 A1 | 8/2001 |
| EP | 0 743 528 A2 | 11/1996 |
| FR | 2 865 973 A1 | 8/2005 |
| GB | 2 400 172 A | 10/2004 |
| WO | WO 2004/072662 A2 | 8/2004 |

* cited by examiner

*Primary Examiner*—Jermele M Hollington
(74) *Attorney, Agent, or Firm*—Davidson, Davidson & Kappel, LLC

(57) ABSTRACT

Apparatus for measuring the electrical energy supplied to a rail traction unit by a high voltage line (1), the apparatus comprising measurement means (5, 26) for measuring the current drawn, and measurement means (12, 27) for measuring the voltage of the power supply, said measurement means themselves possessing a low voltage power supply (23, 24) necessary to enable them to operate, the apparatus being characterized in that the low voltage electrical power supply is taken from light energy converted (22) into electrical energy.

3 Claims, 1 Drawing Sheet

APPARATUS FOR MEASURING THE ELECTRICAL ENERGY DELIVERED TO A RAIL TRACTION UNIT BY A HIGH VOLTAGE LINE

This claims the benefit of French Patent Application No. 06 06797, filed on Jul. 25, 2006, the entire disclosure of which is hereby incorporated by reference.

The present invention relates to an apparatus for measuring the electrical energy delivered, at high voltage, to a locomotive, or more generally to the motor of a rail traction unit.

BACKGROUND OF THE INVENTION

The electrical energy delivered in particular by the catenary to a locomotive needs to be measured in order to enable the supplier to bill consumers. This need is relatively new since it results from recent regulations requiring a plurality of electricity supply operators to be free to compete on a network, and for a plurality of operators to be free to use said energy on the same network.

In principle, implementing such measurement is extremely simple: it suffices to measure the current drawn, its voltage, and the duration of its consumption, either continuously or by sampling at a suitable frequency, so as to take account of variations in those two parameters over time.

In practice, things are much more complicated because the measurement devices are in the environment of a high voltage network (from 1500 volts direct current (DC) to 25,000 volts alternating current (AC) depending on the portions of the network being traveled) when it comes to acquiring the variables, and in a low voltage environment when it comes to generating and processing signals. Those two environments need to be isolated galvanically, which requires particular care and attention.

Known means for providing such galvanic isolation are generally implemented using transformers that are included in the measurement devices, with the level of isolation that is required demanding the use of high quality dielectric materials between the primary and the secondary of such a transformer, and above all requiring a volume that is great enough to keep the conductive parts as far apart as possible from one another.

That volume and that weight need to be located on the roof of the motive power unit. They are in addition to all of the other equipment on the roof of the traction unit such that under the best of circumstances there is an increase in the frontal area of the equipment, thus creating drag that is an impediment for high-speed trains, and more often is quite simply impossible since there is not enough room in this particularly congested space.

SUMMARY OF THE INVENTION

The present invention may provide a solution to the problem of congestion which, without sacrificing isolation requirements, enables the sensors and devices used to be miniaturized sufficiently for them to be housed without impediment in the roof equipment of a rail traction unit.

The present invention provides an apparatus for measuring electrical energy supplied to a rail traction unit by a high voltage line including: a first measurement device for measuring a current drawn by the rail traction unit; a second measurement device for measuring a power supply voltage; and a low voltage power supply for supplying low voltage power to the first and second measurement devices; the low voltage power supply including a light source and an optical/electrical converter, the light source coupled to the optical/electrical converter, the optical electrical converter connected to the first and second measurement devices.

Other characteristics and advantages of the invention appear from the description given below of an embodiment.

BRIEF DESCRIPTION OF THE DRAWINGS

Reference is made to the accompanying drawing, in which.

DETAILED DESCRIPTION OF THE INVENTION

In accordance with an embodiment of the present invention, an apparatus for measuring the electrical energy supplied to a rail traction unit by a high voltage line is provided, the apparatus comprising measurement means for measuring the current drawn and measurement means for measuring the voltage of the power supply, said measurement means possessing a low voltage power supply necessary to enable them to operate, in which the low voltage power supply energy is taken from light energy converted into electrical energy in the high voltage environment. Furthermore, the output signals from the measurement means are converted into light signals in order to enable them to be used. Thus, a very high level of galvanic isolation may be achieved between the high voltage stage of the measurement devices and the low voltage stage thereof. The conversion of electrical energy into light energy and vice versa is performed by means of known devices of small size that thus allow the measurement apparatus to be housed in a small volume, and in particular in an insulator for the high voltage roof cable of the rail unit.

Figure 1:
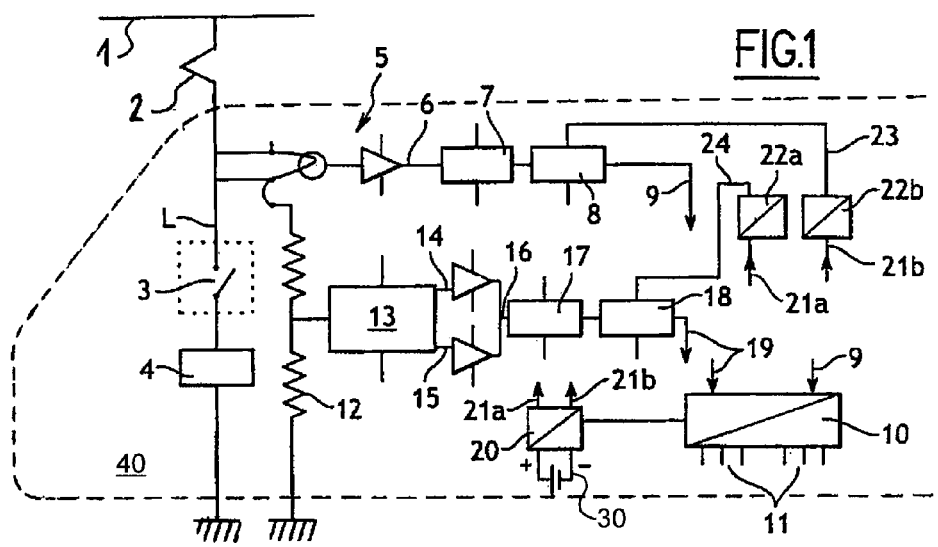
FIG. 1 is an electrical circuit diagram of measurement apparatus in accordance with the invention.

In FIG. 1, reference 1 designates the catenary while the pantograph of the unit is represented by reference 2. The roof high voltage line of the rail unit 40 is referenced L and it passes through a circuit breaker 3 prior to reaching the set of means for powering the traction system 4.

In series with the line L, and in a conventional manner, a current sensor 5, e.g. a current-measurement shunt, serves to deliver an analog signal at its output 6 that is converted into a digital signal by a converter 7 whose output leads to an electrical/optical converter 8 that transforms the digital electrical signal from the converter into a light signal that is conveyed by an optical fiber 9 to an optical/electrical converter 10 having outputs 11 for connection to the electronics that responds to said signal from the current transformer and representative of the current fed at high voltage to the unit.

A voltage divider 12 serves to enable a discriminator 13 to sense DC or AC voltages and to produce signals representative of said voltages. For example, the signal present at the output 14 of the discriminator 13 represents the voltage of the AC present on the catenary 1.

The output 15 is reserved for a signal representative of a DC voltage on the catenary 1.

One of these signals is taken to the input 16 of an analog-to-digital converter 17 whose output is applied to the input of an electrical/optical converter 18. The light signal generated by the converter 18 is conveyed by an optical fiber 19 to the input of the converter 10 which presents in response thereto an electrical signal on some of its outputs 11 for use by the apparatus in combination with the electrical signal representative of the power supply current taken.

In order to operate, some of the components of the apparatus need to be powered with electricity, in particular the electrical/optical converters or the optical/electrical converters such as those referenced 8, 18 and 10. The converter 10 is powered directly by a battery 30 which is connected to a converter 20 for converting DC electricity into light energy in the form of a laser beam emitted by a light-emitting system such as a diode. The laser beam is conveyed by optical fibers 21a, 21b to optical/electrical converters 22a, 22b possessing respective outputs 24 for powering the electrical/optical converter 18 and 23 for powering the electrical/optical converter 8.

Figure 2:
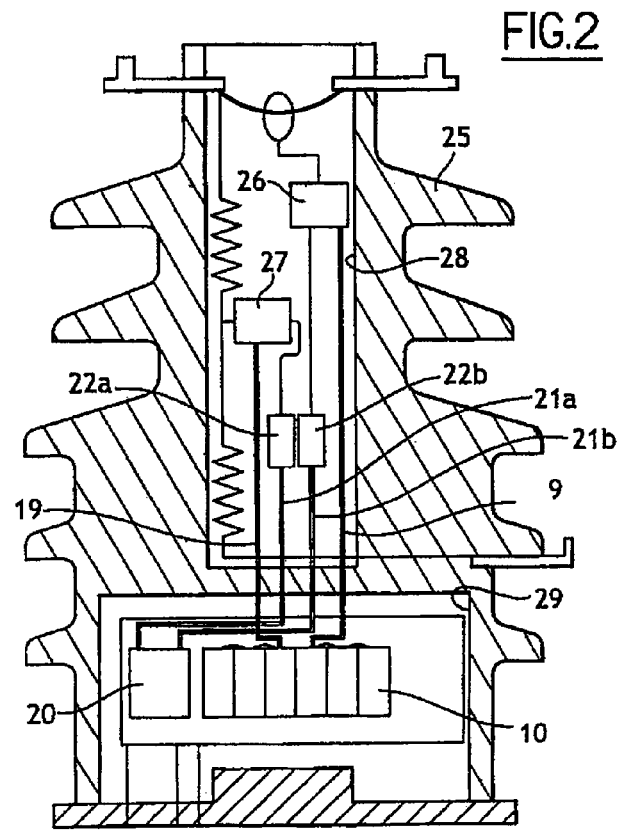
FIG. 2 is a diagram showing how the measurement apparatus is installed in an insulator for the high voltage roof cable of the rail unit consuming the energy being measured.

FIG. 2 shows the circuit of FIG. 1 installed inside an insulator body 25, and thus shows how complete galvanic isolation is ensured in the measurement apparatus of the invention. This figure shows most of the elements described above with the same references. The elements relating to processing the signal from the current sensor 5 are grouped together diagrammatically in a block 26 powered at low voltage by the line 23 and outputting the light signal representative of the measured current on an optical fiber 9.

Similarly, the means for processing the voltage signal from the divider 12 are grouped together in a block 27 where the power supply line 24 terminates and from which there comes the optical fiber 19. It can be understood from this figure that the high voltage environment is confined in a top space 28 formed in the insulator 26 through which the roof cable L of the rail unit passes, while the low voltage environment is confined in a bottom recess 29 of said insulator. Between the two recesses, only optical fibers provide a link between the various components of the apparatus of the invention.

The measurement apparatus of the invention may also be used as means for recognizing the network (from the voltage of the electricity delivered to the traction unit), which may be, for example, 1500 volts DC, 3500 volts DC (generally processed as above), 15,000 volts AC at 16⅓ Hz, 25,000 volts AC at 50 Hz or at 60 Hz, 12,000 volts AC at 60 Hz, or 12,000 volts AC at 25 Hz, to mention only those configurations that are to be found in the main industrialized countries. The optical signal present at the output of the fiber 19 is representative of a measurement voltage of value that corresponds to the voltage of the network electricity. Thus, each of the three outputs 11 associated with voltage can be allocated to one of the voltages that the network might offer, by using a set of relays in the converter means 10. The presence of a signal on only one of the three outputs 11 allocated to voltage makes it possible to recognize the voltage of the network along which the rail unit is traveling.

The invention claimed is:

1. An apparatus for measuring electrical energy supplied to a rail traction unit by a high voltage line comprising:
   a first measurement device for measuring a current of the electrical energy drawn by the rail traction unit;
   a second measurement device for measuring a power supply voltage of the electrical energy supplied;
   a first electrical/optical converter converting electrical output signals from the first or second measurement device into light signals, the light signals conveyed by optical fibers to a first optical/electrical converter; and
   a low voltage power supply supplying low voltage power to the first and second measurement devices; the low voltage power supply including a second electrical/optical converter generating light which is conveyed by optical fibers to a second optical/electrical converter,
   wherein the first and second measurement devices, the first electrical/optical converter and the second optical/electrical converter are first components housed in a first space in an insulator of a high voltage line of the rail traction unit, and the first optical/electrical converter and the second electrical/optical converter are second components housed in a second space in the insulator, the first and second spaces being spaced apart, the optical fibers providing a link between the first components in the first space and the second components in the second space.

2. The apparatus for measuring electrical energy supplied to the rail traction unit by the high voltage line as recited in claim 1 wherein the first optical/electrical converter has a plurality of outputs for recognizing a network whenever a signal is present on the outputs.

3. The apparatus for measuring electrical energy supplied to the rail traction unit by the high voltage line as recited in claim 1 further comprising a battery connected to the second electrical/optical converter.

* * * * *